(12) United States Patent
Singh

(10) Patent No.: US 9,350,323 B2
(45) Date of Patent: May 24, 2016

(54) MITIGATION OF INTERFERENCE BETWEEN FM RADIO AND DISPLAY SUBSYSTEMS ON A MOBILE DEVICE

(71) Applicant: QUALCOMM Incorporated, San Diego, CA (US)

(72) Inventor: Anender Singh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/465,918

(22) Filed: Aug. 22, 2014

(65) Prior Publication Data

US 2016/0056795 A1    Feb. 25, 2016

(51) Int. Cl.
*H04B 1/40*   (2015.01)
*H03J 7/02*   (2006.01)

(52) U.S. Cl.
CPC ........................................ *H03J 7/02* (2013.01)

(58) Field of Classification Search
CPC ........ H04B 15/04; H04B 1/0475; H04B 1/10; H04B 1/1036; H04B 1/44; H04B 2001/1063; H04B 15/02; H04B 15/06; G06F 1/3262; G06F 3/0416; G06F 3/044; G06F 1/08; F25B 39/02
USPC ........... 455/75, 332, 323, 333, 77, 41.1, 41.2, 455/132, 68, 226.1, 296, 312, 306, 65, 297, 455/131, 62; 382/218; 375/200, 344, 238, 375/239, 242; 345/2.1, 690, 102, 590, 204; 358/127
See application file for complete search history.

(56) References Cited

U.S. PATENT DOCUMENTS

| | | | | |
|---|---|---|---|---|
| 5,722,063 A * | 2/1998 | Peterzell | ................... | H03F 3/72 455/13.4 |
| 6,091,765 A * | 7/2000 | Pietzold, III | ........... | H03G 3/345 375/219 |
| 6,725,027 B1 * | 4/2004 | Tsuji | ................... | H04B 1/1081 455/226.1 |
| 8,086,185 B2 * | 12/2011 | Rousu | ............... | G01R 29/0835 455/67.11 |
| 8,195,094 B1 * | 6/2012 | Briskman | .............. | H04B 1/034 455/42 |

(Continued)

FOREIGN PATENT DOCUMENTS

CN    102035604 A    4/2011
CN    102637418 B    7/2014

OTHER PUBLICATIONS

International Search Report and Written Opinion—PCT/US2015/046069—ISA/EPO—Nov. 3, 2015.

*Primary Examiner* — Tan H Trinh
(74) *Attorney, Agent, or Firm* — Muncy, Geissler, Olds & Lowe, P.C.

(57) ABSTRACT

Systems and methods for mitigating interference or concurrency between frequency modulation (FM) radio subsystem and a display subsystem relate to determining potential concurrency between the two subsystems at particular FM modes of operation, and adjusting one or more display parameters of the display subsystem and additionally or alternatively, implementing filters in the FM subsystem in order to avoid or mitigate the potential concurrency. The FM modes comprise one or more FM operating bands or FM channels, and the display parameters comprise one or more of a display refresh rate, display clock frequency, and backlight brightness.

27 Claims, 7 Drawing Sheets

(56) References Cited

U.S. PATENT DOCUMENTS

| | | | |
|---|---|---|---|
| 8,483,333 B2 | 7/2013 | Yang et al. | |
| 8,626,102 B1* | 1/2014 | Bidichandani | H04B 15/04 455/164.2 |
| 2003/0236075 A1* | 12/2003 | Johnson | H04B 1/04 455/99 |
| 2005/0007261 A1* | 1/2005 | Berson | G01C 23/00 340/945 |
| 2007/0224940 A1* | 9/2007 | Pankinaho | H04B 15/04 455/62 |
| 2008/0160928 A1* | 7/2008 | Tsfaty | H04H 60/13 455/77 |
| 2008/0204460 A1* | 8/2008 | Marinkovic | G06F 1/3203 345/502 |
| 2008/0212785 A1* | 9/2008 | Ullmann | H04H 20/08 381/2 |
| 2009/0138745 A1 | 5/2009 | Dorsey et al. | |
| 2009/0163159 A1* | 6/2009 | Ooi | H03J 1/005 455/131 |
| 2009/0168800 A1* | 7/2009 | Leinonen | H04B 1/3805 370/464 |
| 2010/0137025 A1* | 6/2010 | Tal | H04B 15/02 455/553.1 |
| 2012/0144224 A1* | 6/2012 | Machnicki | H04B 15/06 713/500 |
| 2013/0021303 A1 | 1/2013 | Martin et al. | |
| 2013/0033477 A1* | 2/2013 | Sirpal | G06F 1/1616 345/211 |
| 2013/0115905 A1* | 5/2013 | Haralabidis | H04B 1/406 455/259 |
| 2013/0196609 A1 | 8/2013 | Ancora et al. | |
| 2013/0328796 A1* | 12/2013 | Al-Dahle | G06F 3/041 345/173 |
| 2013/0328797 A1* | 12/2013 | Al-Dahle | G06F 3/0416 345/173 |
| 2015/0072615 A1* | 3/2015 | Mofidi | H04B 1/525 455/41.1 |

* cited by examiner

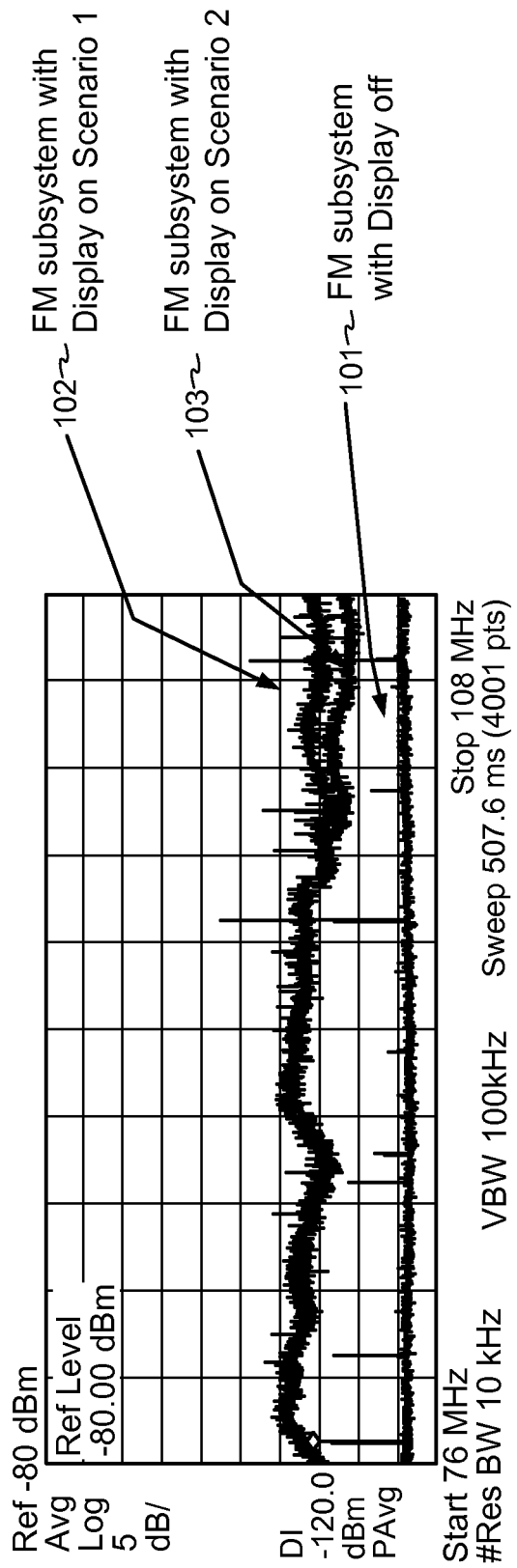
CONVENTIONAL
FIG. 1A

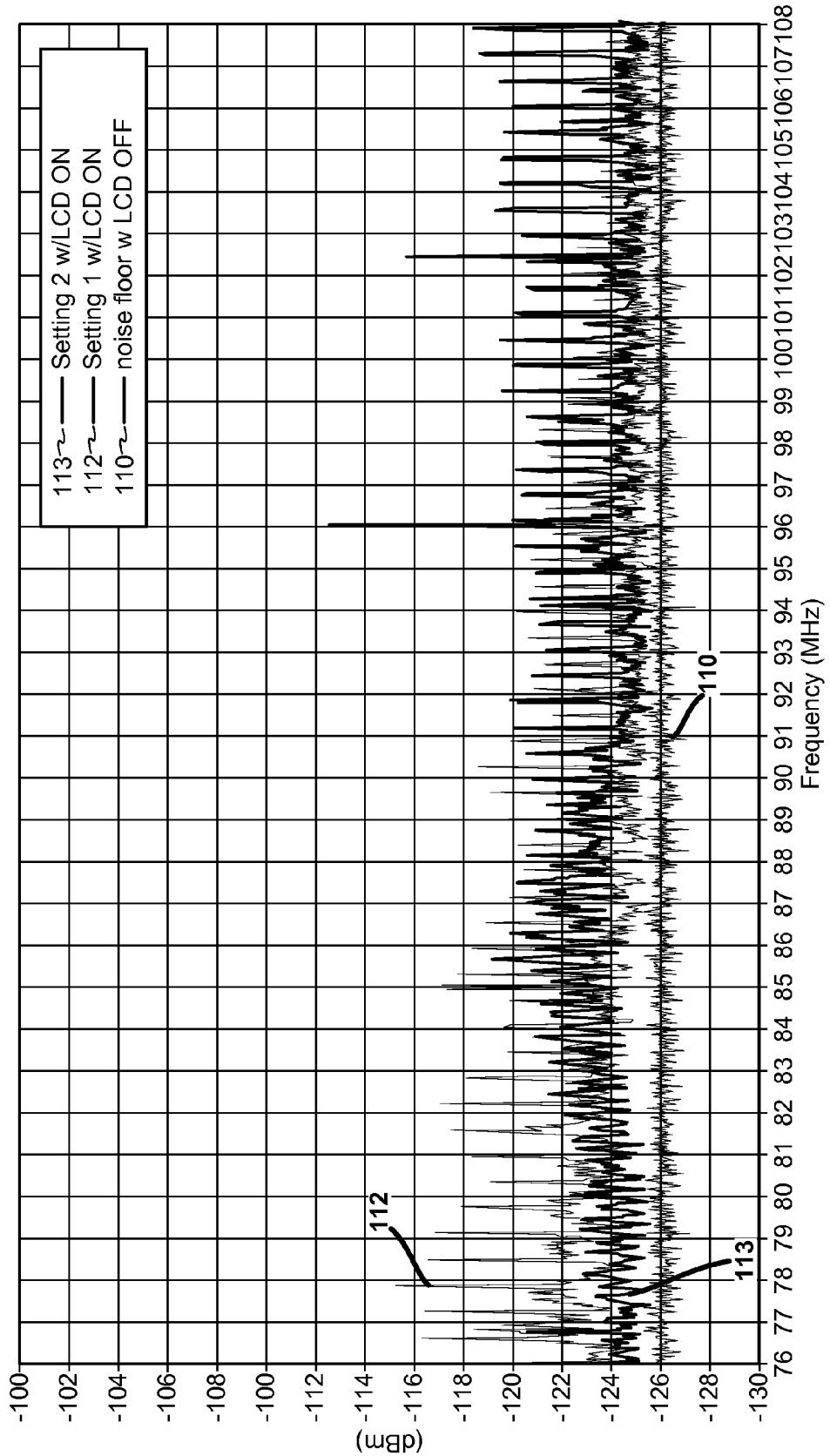
CONVENTIONAL
FIG. 1B

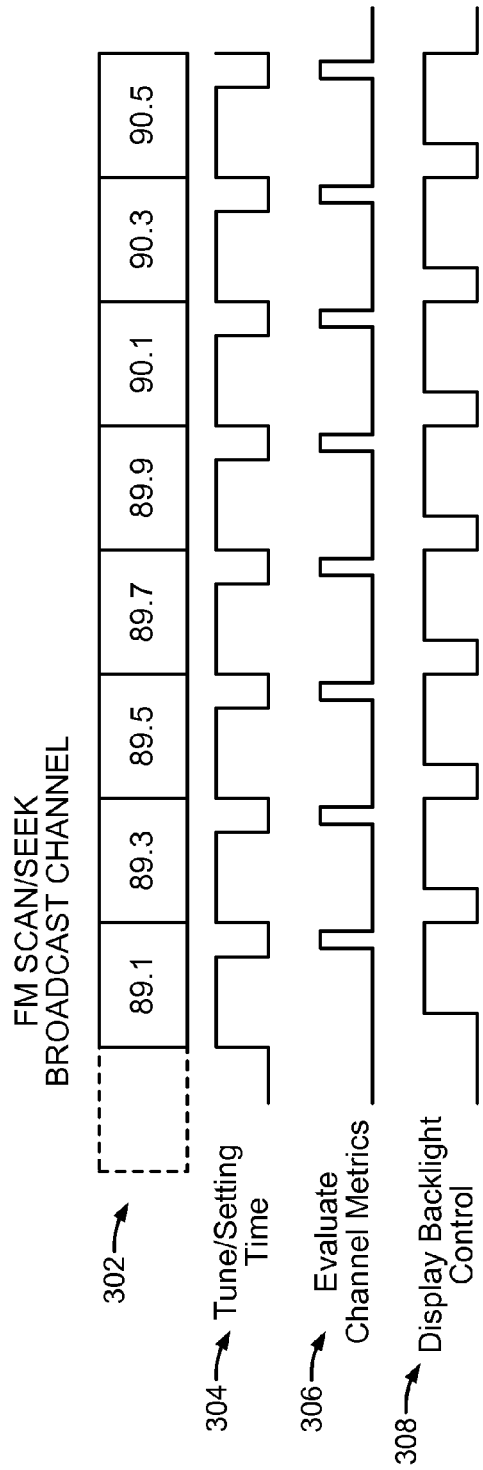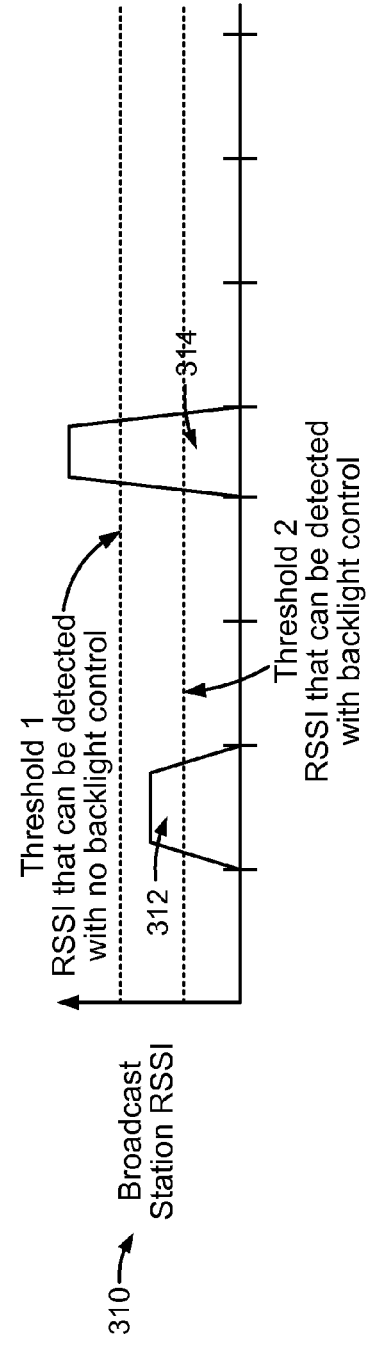
FIG. 3A
FIG. 3B

MITIGATION OF INTERFERENCE BETWEEN FM RADIO AND DISPLAY SUBSYSTEMS ON A MOBILE DEVICE

FIELD OF DISCLOSURE

Disclosed aspects are directed to mitigating interference between frequency modulation (FM) radio subsystem and a display subsystem. Exemplary aspects relate to determining potential concurrency between the two subsystems at particular FM modes of operation, and adjusting one or more display parameters of the display subsystem and additionally or alternatively, implementing filters in the FM subsystem in order to avoid or mitigate the potential concurrency.

BACKGROUND

Mobile devices such as cellular telephones, wireless communication devices, laptop computers, handheld multimedia devices, tablet computers, etc., conventionally involve integration of various subsystems on a chip or integrated circuit. For example, mobile devices may include one or more components or subsystems such as, processing cores, antennae, transceivers, memory or storage elements, and user interfaces such as microphones, speakers, keypads, display systems, etc. These subsystems may be integrated on a single chip solution or packaged within close proximity of one another. The subsystems may operate under varying operating conditions such as operating voltage, frequency, temperature, etc. Sometimes interference or concurrency may arise due to conflicting operating conditions between two or more subsystems.

For example, frequency interference may arise between two or more components or subsystems of a mobile device. More specifically, a radio frequency subsystem may include a FM subsystem or FM transceiver, with a conventional operating frequency in the general range of 76 MHz to 108 MHz. While in general, processing cores operating at a much higher frequency of 1-2 GHz may not interfere with the FM subsystem, it may be possible for harmonics of the local oscillator (local clock) of the FM subsystem to mix down higher frequency components in the 1-2 GHz range, therefore potentially interfering with the FM frequency reception. Further, lower harmonic frequencies of operation of other subsystems may overlap with or interfere with the FM operating frequency. One component which may be of particular concern with regard to causing interference with the FM subsystem is a display subsystem.

A display subsystem may include, among various other components, a display driver and a display device such as a liquid crystal display (LCD). The display driver may control the operating frequency or clock for the display system. With conventional settings, it is possible that when the display subsystem is turned on (e.g., a mobile phone's display or display backlight is active or turned on), that the frequency of operation of the display subsystem may interfere with the FM subsystem. Accordingly, when the display subsystem is turned on, the FM subsystem may suffer from degraded performance due to noise arising from the interference. Performance degradation in the FM subsystem may be in the order of 10-15 dB, which may severely impact quality and user experience. Such interference between the FM subsystem and display subsystem is also referred to as a FM-display concurrency issue.

Conventional approaches to resolve the FM-display concurrency issue and mitigate the interference or noise caused by the display subsystem on the FM subsystem have involved complex layout design guidelines. Such layout guidelines may specify various requirements for ground isolation, shielding, and on-chip placement restrictions on the FM subsystem and the display subsystem. However, such approaches have limited success and they are not adaptable to process variations. For example, the carefully designed isolation and shielding at the time of manufacture may not be sufficient to prevent interference under operating conditions. With shrinking device sizes, there may be very limited flexibility to design the on-chip placement of the FM subsystem and display subsystem, such that they are sufficiently separated to effectively avoid or mitigate the concurrency issue. Moreover, layout and placement techniques tailored for the FM subsystem and the display subsystem may be limited in the context of designing the entire systems on a chip, because conflicting requirements may arise from the placement requirements of other components or subsystems on the chip.

Accordingly, there is a need in the art for overcoming the aforementioned limitations of conventional approaches with regard to the FM-display concurrency issue.

SUMMARY

Exemplary embodiments include systems and methods for mitigating interference or concurrency between a frequency modulation (FM) radio subsystem and a display subsystem. Aspects of this disclosure relate to determining potential concurrency between the two subsystems at particular FM modes of operation, and adjusting one or more display parameters of the display subsystem and additionally or alternatively, implementing filters in the FM subsystem in order to avoid or mitigate the potential concurrency. The FM modes comprise one or more FM operating bands or FM channels, and the display parameters comprise one or more of a display refresh rate, display clock frequency, and backlight brightness.

Accordingly, an exemplary embodiment is directed to a method of reducing frequency modulation (FM)-display concurrency in an electronic device, the method comprising: determining a FM mode of operation of a FM subsystem, determining a potential concurrency between a display subsystem and the FM subsystem based on the FM mode of operation, and adjusting one or more display parameters of the display subsystem in order to avoid the potential concurrency.

Another exemplary embodiment is directed to an electronic device comprising: a frequency modulation (FM) subsystem, a display subsystem, and a processor. The processor is configured to determine potential concurrency between the display subsystem and the FM subsystem based on one or more display parameters of the display subsystem and one or more FM modes of the FM subsystem, and adjust the one or more display parameters to avoid the potential concurrency.

Another exemplary embodiment is directed to a system comprising: means for determining a frequency modulation (FM) mode of operation of a FM subsystem, means for determining a potential concurrency between a display subsystem and the FM subsystem based on the FM mode of operation, and means for adjusting one or more display parameters of the display subsystem in order to avoid potential concurrency between the FM subsystem and the display subsystem.

Yet another exemplary embodiment is directed to a non-transitory computer-readable storage medium comprising code, which, when executed by a processor, causes the processor to perform operations for reducing frequency modulation (FM)-display concurrency in an electronic device, the non-transitory computer-readable storage medium comprising: code for determining a FM mode of operation of a FM subsystem, code for determining a potential concurrency between a display subsystem and the FM subsystem based on the FM mode of operation, and code for adjusting one or more display parameters of the display subsystem in order to avoid the potential concurrency.

BRIEF DESCRIPTION OF THE DRAWINGS

The accompanying drawings are presented to aid in the description of embodiments of the invention and are provided solely for illustration of the embodiments and not limitation thereof.

FIGS. 1A-B illustrate graphical views of noise observed by a conventional FM subsystem.

FIGS. 3A-B and 4, illustrate exemplary aspects of adjusting parameters of display subsystem 256 based on a mode of operation of FM subsystem 206.

DETAILED DESCRIPTION

Figure 2A:
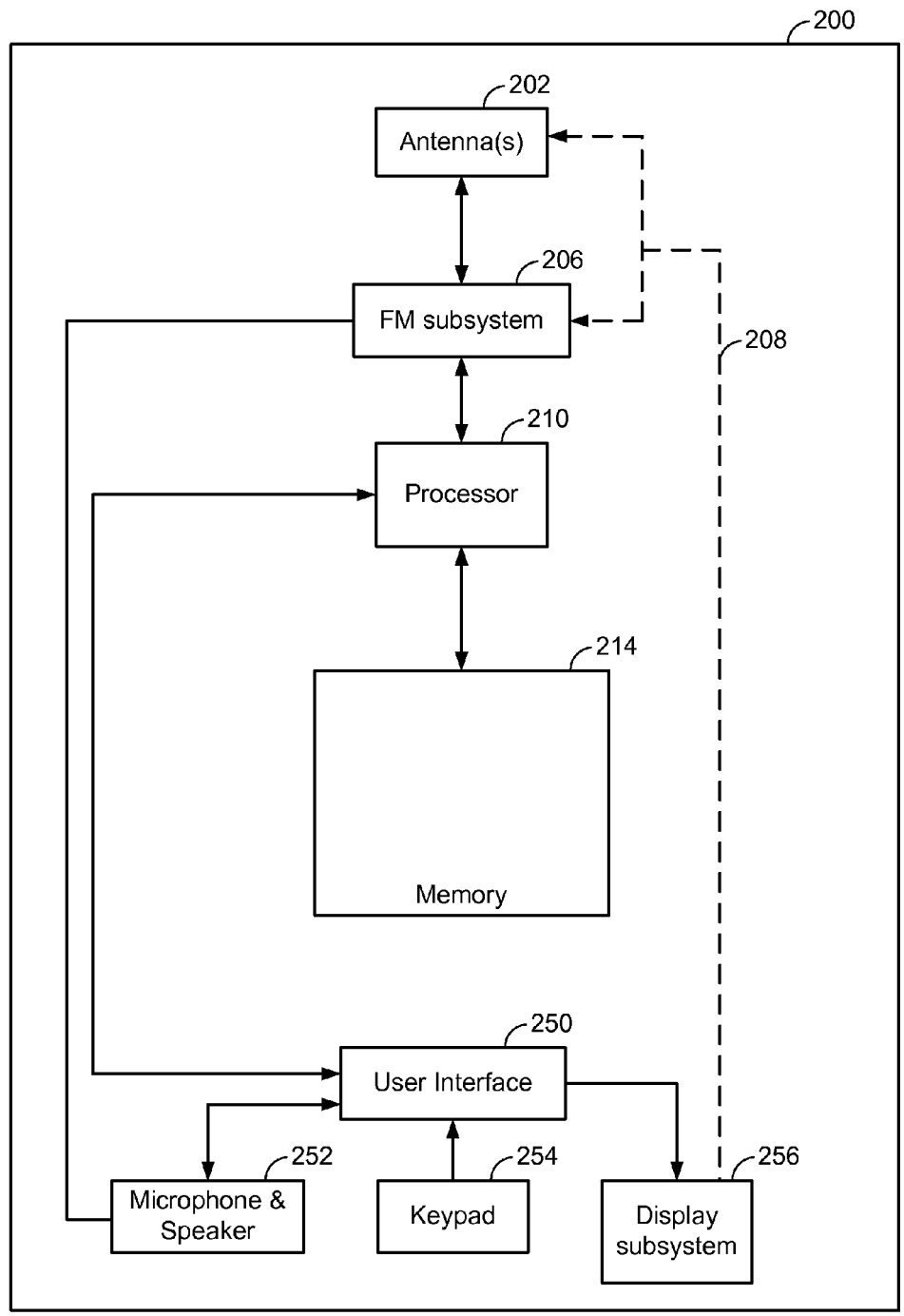
FIG. 2A illustrates a schematic block diagram of an exemplary device 200 configured for FM-display concurrency avoidance or mitigation.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Aspects of this disclosure include systems and methods for avoiding or mitigating interference between an FM subsystem and a display subsystem of an exemplary electronic device. One or more signaling interfaces may be used for communicating information about the two subsystems to one another or to a processing means. Various parameters and operating modes of the two subsystems may be adjusted to avoid or mitigate potential concurrency based on this information. Exemplary aspects for concurrency mitigation may be implemented in hardware and/or software, and may be in addition to or in place of existing solutions for mitigating noise, such as layout guidelines, shielding, relative placement, etc.

With reference first to FIG. 1A, a graphical view of noise observed by a conventional FM subsystem or FM core is illustrated. In FIG. 1A, the FM subsystem is turned off, or inactive, i.e., the FM subsystem is not actively engaged in receiving or transmitting FM radio signals. In FIG. 1A, the noise levels induced by a conventional display subsystem are observed, for example, using a spectrum analyzer connected to the FM subsystem. The observed noise levels are plotted for cases when the display is turned off and two scenarios where the display is turned on. The illustrated plots include the conventional range of operation of the FM subsystem, between 76 MHz and 108 MHz.

As seen from the plot 101 of the noise observed by the FM subsystem when the display is off, there is a noise floor of around −125 dB. As skilled persons will recognize, this is a large noise floor indicating that even when the display is completely off, there is an appreciable level of interference on the FM subsystem. With reference to plot 102, a first scenario is illustrated when the display subsystem is turned on, and the display has a first backlight brightness, for example. In plot 102, the noise is observed to increase in the order of 10-15 dB, bringing the noise to around −120 dB. With reference to plot 103, a second scenario is illustrated where the display is turned on with a second backlight brightness. In plot 103, the noise is seen to be slightly lower than in plot 102, particularly in the higher frequency range of the FM subsystem. From these plots of FIG. 1A, it is observed that changing parameters of the display subsystem, for example, with regard to backlight brightness, can increase or decrease the noise impact on the FM subsystem. Exemplary aspects may pertain to adjusting such parameters of an exemplary display subsystem such that noise impact on an exemplary FM subsystem can be avoided.

With reference to FIG. 1B, another graphical view of the noise spurs on a conventional FM subsystem is illustrated, when the FM subsystem is turned on and actively receiving FM radio signals for example. Once again, plots of noise impact by a conventional display subsystem on the FM subsystem within the conventional 76-108 MHz bandwidth or range of operation are illustrated. In FIG. 1B, the possible frequencies at which FM signals are conventionally transmitted or received, or transmission bands, in North America are spaced 200 KHz apart. Once again, the noise floor is provided by plot 110 when the display (e.g., a liquid crystal display (LCD)) is turned off, and this noise floor is seen to be high, at −126 dB. With reference to plots 112 and 113 different impacts on the noise observed by the FM subsystem for different settings when the LCD is turned on are illustrated. These settings may pertain to various operational modes or implementations of shielding techniques. For example, plot 112 may relate to a first setting pertaining to shielding or based on a particular display parameter such as refresh rate or backlight brightness of the LCD. Similarly, plot 113 may relate to a second setting pertaining to shielding or based on display parameters. As observed, there are variations in the magnitude of spikes or spurs, as well as, the frequencies at which these spikes occur. Focusing on a specific frequency, for example, at 78 MHz, it is seen that while there are large spikes for plot 112, the noise level as well as spikes are much lower for plot 113. On the other hand, for a higher frequency zone, such as at 96 MHz, plot 113 shows a large spike, whereas plot 112 displays smaller noise levels and lower spikes. These differences may provide valuable clues for controlling noise impact on exemplary embodiments. For example, it may be known that for a particular frequency or FM mode, one of plot 112 or plot 113 would provide the least noise impact. Thus the setting which provides the least noise impact may be chosen. While only two settings are illustrated for the sake of explanation, numerous settings may be possible at each frequency or FM mode which may deliver the lowest noise impact on the FM subsystem when the display is turned on. Therefore, exemplary aspects may pertain to adjusting the various settings in an exemplary FM subsystem, in order to mitigate the spurs at the various transmission bands or FM modes.

With reference now to FIG. 2A, a schematic block diagram comprising various components of an exemplary device 200 is illustrated. Device 200 may be or integrated in an electronic device such as a mobile phone, laptop computer, general or special purpose processor, personal computer (PC), gaming device, multimedia device, etc. For the sake of simplicity, an exhaustive illustration of all possible components which may be found on device 200 has been avoided. Those skilled in the art will recognize that other connections, mechanisms, features, functions, or the like, may be provided and adapted as necessary. Further, it is also recognized that one or more of the features or functions illustrated in the example of FIG. 2A may be further subdivided or two or more of the features or functions illustrated in FIG. 2A may be combined.

Device 200 is shown to include processor 210, which may include one or more microprocessors, microcontrollers, or digital signal processors that provide processing functions, as well as other calculation and control functionality. Processor 210 may be operatively configurable based on instructions in memory 214. Device 200 may include user interface 250 which provides any suitable interface systems, such as microphone and speaker 252, keypad 254, and display subsystem 256 that allows user interaction with mobile device 200. Display subsystem 256 is further described with reference to FIG. 2C. Processor 210 may also be coupled to FM subsystem 206 which is coupled to one or more antenna(s) 202. FM subsystem 206 is further described with reference to FIG. 2B. The one or more antenna(s) 202 may be capable of sending and receiving communication signals outside of device 200, which may include, but are not limited to wireless communication signals such as satellite signals, radio signals, wireless network signals (e.g., WiFi), and wired signals.

Figure 2B:
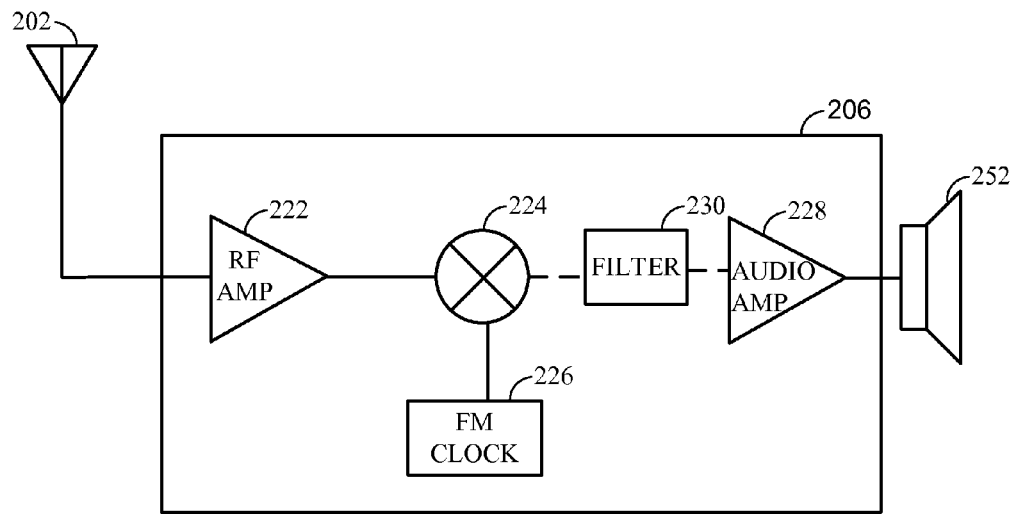
FIG. 2B illustrates a schematic block diagram of FM subsystem 206 shown in device 200.

Referring now to FIG. 2B, a simplified schematic block diagram of FM subsystem 206 is shown. FM subsystem 206 is generally configured for sending, receiving, and processing FM signals. More specifically, FIG. 2B depicts functional blocks related to a FM receiver as an illustrative example. It will be understood that FIG. 2B does not provide an exhaustive illustration of all functional blocks of FM subsystem 206, and as such, FM subsystem may have additional blocks or alternative configurations for functions including but not limited to FM transmission. As shown, radio signals received from at least one antenna 202 may be fed into a radio frequency (RF) amplifier 222. The amplified RF signals are fed into mixer 224. Mixer 224 is driven by a local oscillator or FM clock 226. FM clock 226 may be derived from a system clock (not shown) for device 200. The output of mixer 224 provides an audio frequency signal which may pass through filter 230 as well as one or more additional blocks which are not shown (e.g., a demodulation block), before being amplified by audio amplifier 228. The output of audio amplifier 228 may be provided to a speaker, which may be part of the block depicted as microphone and speaker 252 in FIG. 2A. Filter 230 may be used to implement a damping feature in exemplary aspects that will be described in the following sections. In general, FM subsystem 206 may be configured as shown in FIG. 2B for receiving and processing FM radio signals. Although illustrated as a standalone block for the purposes of this description, FM subsystem 206 may be part of a larger radio subsystem (not illustrated).

Figure 2C:
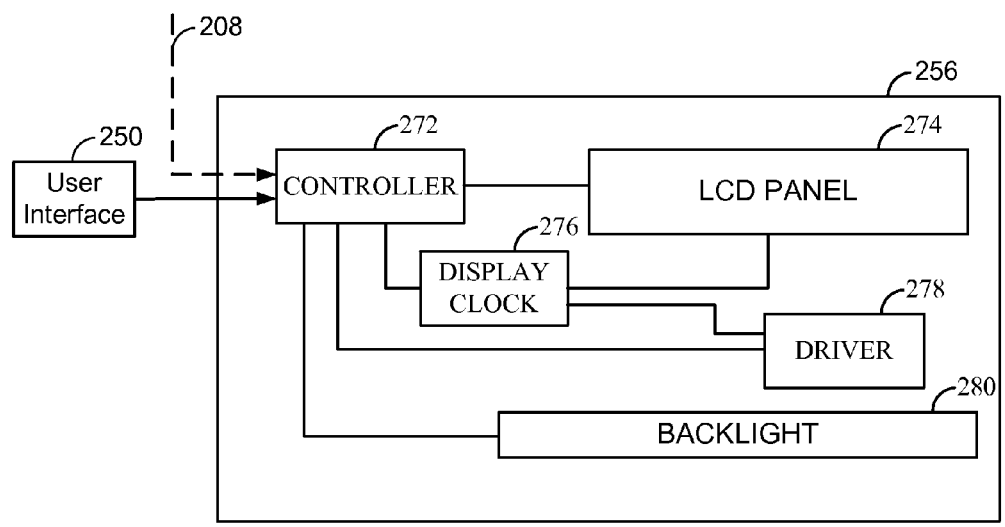
FIG. 2C illustrates a schematic block diagram of display subsystem 256 shown in device 200.

With reference now to FIG. 2C, a simplified schematic block diagram of display subsystem 256 is shown. In general, display subsystem 256 is configured to for providing a display to a user. Display subsystem 256 may include a display panel such as LCD panel 274, as well as components such as driver 278, and backlight 280. Driver 278 may accept commands from controller 272 and generate signals pertaining to voltage, current, timing, etc., for displaying corresponding data or images on LCD panel 274. Backlight 280 may provide backlighting to LCD panel 274. Controller 272 may receive commands from user interface 250 and optionally from interface 208, which will be further discussed below. Controller 272 may control LCD panel 274 as well as one or more additional blocks of display subsystem 256, such as, driver 278 and backlight 280, according to aspects of this disclosure. Display system 256 may be supplied with display clock 276, which can also be derived from the system clock. Display clock 276 is representatively shown as an input to controller 272, LCD panel 274 and driver 278. However, it will be understood that display clock 276 may be used for clocking other functional blocks of display subsystem 256.

As indicated above, FM clock 226 and display clock 276 may be derived from the system clock. This would prevent FM clock 226 and display clock 276 from drifting with respect to one another, and thus, also enabling easier identification of frequency harmonics of spurs caused due to interference between display subsystem 256 and FM subsystem 206. In some aspects, it is possible to also individually generate and control FM clock 226 and display clock 276.

Some aspects may relate to static or dynamic adjustments pertaining to one or more modes of FM subsystem 206 and additionally or alternatively, one or more parameters related to display subsystem 256, in order to reduce the impact of interference between these two subsystems. As such, although FM subsystem 206 has been illustrated in FIGS. 2A-B to be a separate block from antenna(s) 202, it will be recognized that the noise impact from display subsystem 256 pertaining to FM transmission or reception may also be experienced by one or more antenna(s) 202 related to the FM transmission or reception. In some examples, the interference from display subsystem 256 may be observed by antenna(s) 202 and passed on to FM subsystem 206. Accordingly, it will be kept in mind that although the description herein will primarily be directed to FM subsystem 206 and display subsystem 256, other components such as antenna(s) 202 may also be involved in exemplary aspects of mitigating the noise or coherency issues, and skilled persons will recognize techniques to extend the disclosed aspects to such other components as required, based on this disclosure.

Particularly in some aspects, FM subsystem 206 (and in some cases, antenna(s) 202, as noted above) may experience interference. Therefore parameters of display subsystem 256 may be adjusted in advance to avoid or preclude the impact of such interference on FM subsystem 206. Knowledge of behavior of FM subsystem 206 under particular conditions or modes may be stored in processor 210, for example, such that if FM subsystem 206 were to enter such a mode, then processor 210 may direct display subsystem 256 to adjust one or more parameters accordingly, such that interference on FM subsystem 206 can be minimized or avoided. Knowledge of behavior of FM subsystem 206 can be communicated to processor 210 by FM subsystem 206 or processor 210 may actively monitor the behavior of FM subsystem 206.

In accordance with some aspects dynamic communication between FM subsystem 206 and display subsystem 256 may also be possible. For example, a signaling interface or communication channel or communication means between FM subsystem 206 and display subsystem 256, representatively illustrated as interface 208 in FIG. 2A, may be provided in order to enable such dynamic communication. Interface 208 may be implemented in software, for example, by means of processor 210 coupled to user interface 250, or in some cases, interface 208 may involve a dedicated communication channel or hardware including wires or nets to promote communication between FM subsystem 206 (in conjunction with antenna(s) 202 as needed) and display subsystem 256 in either direction.

Whether adjustments of parameters of display subsystem 256 is initiated by processor 210 based on knowledge of modes of FM subsystem 206 or whether such adjustments may be based on dynamic communication, for example, through interface 208, two directions are defined in this disclosure with regard to adjustments for mitigating noise impact on FM subsystem 206 from display subsystem 256. A first direction may relate to adjusting parameters of display subsystem 256 based on knowledge or communication of modes of operation of FM subsystem 206, for mitigating the FM-display concurrency. A second direction may relate to adjusting modes of FM subsystem 206 based on knowledge or communication of parameters of display subsystem 256. The first and second directions will be explained in further detail below with examples.

In the first direction, one or more modes in which FM subsystem 206 is operating is used to alter parameters of display subsystem 256, for example, by sending commands through interface 208 to controller 272. One such mode of FM subsystem 206 may relate to the FM band or channel to which FM subsystem 206 is tuned to. A spectrum analyzer (not shown) may be configured to analyze noise experienced by FM subsystem 206 for each FM band or channel (e.g., according to FIG. 1B). Thus, based on the FM band or channel in which FM subsystem 206 is operating, the likely noise impact by display subsystem 256 on FM subsystem 206 may be known. Another mode of FM subsystem 206 according to exemplary aspects may relate to received signal strength indication (RSSI) of particular FM channels, which can also be used to reduce noise impact by display subsystem 256 on FM subsystem 206.

Based on the information pertaining to the mode of operation of FM subsystem 206, controller 272 of display subsystem 256 may be configured to cause parameters of display subsystem 256 to be adjusted in order to mitigate the noise. One such parameter may relate to a frequency (e.g., digital serial interface (DSI) frequency) for LCD panel 274 (or other display means of display subsystem 256). For example, if the noise impact on FM subsystem 206 is determined to be high based on the mode, then display clock 276 or settings in LCD panel 274 may be adjusted such that the DSI frequency of LCD panel 274 may be adjusted such that interference or concurrency is reduced.

Another parameter for display subsystem 256 may relate to a refresh rate of the display such as LCD panel 274. The refresh rate is conventionally represented in terms of frames per second (FPS). LCD panel 274, for example, when utilized for displaying video, may support a range of configurable FPS while satisfying standards for quality or user experience. Based on the mode of FM subsystem 206, corresponding noise impact may be determined and conveyed to controller 272. Based on this, the refresh rate of LCD panel 274 may be adjusted. For example, changing the refresh rate from 50 FPS to 60 FPS may damp a potential spur of an FM band. In some cases, partial frame updates may be possible, based on the FM mode for mitigating potential spurs.

Another parameter for display subsystem 256 may relate to brightness of backlight 280. Reducing brightness of backlight 280 may reduce noise emissions from display subsystem 256 on FM subsystem 206. Thus, in an exemplary embodiment, the FM mode may be provided to controller 272, which may direct backlight 280 to adjust its brightness accordingly. Relating this exemplary aspect back to FIG. 1A, it will be appreciated that by adjusting the backlight display appropriately, the noise levels indicated by plots 102 and 103 can be reduced.

With reference now to FIGS. 3A-B, an exemplary operation pertaining to adjusting parameters of display subsystem 256 based on a mode of FM subsystem 206 is illustrated. More specifically, in FIG. 3A, an example FM scan or seek operation is illustrated, wherein parameters related to the display backlight or brightness can be adjusted for particular time intervals (e.g., during times leading up to evaluation of channel metrics) based on RSSI of FM signals received at FM subsystem 206. In some cases, it may be possible to provide feedback to a user based on channel metrics evaluation as a result of adjustments to the display backlight. For example, if the process of the FM seek or FM scan is affected by increased noise or has poor signal to noise ratio (SNR) due to the display backlight, or if the RSSI is in an unacceptable range which cannot be fixed by the display backlight adjustments, then the user of device 200 may be provided with a valid or invalid channel result for the particular FM channel which is affected beyond acceptable noise margins In further detail, with reference to FIG. 3A, FM channels 302 represent a segment of available FM channels for FM subsystem 206 in the range of 89.1 to 90.5 MHz with 0.2 MHz increments. The waveforms represented in FIG. 3 may be based clock cycles of FM clock 226. Waveform 304 represents tuning periods for FM channels 302. More specifically, the time durations within a channel when waveform 304 is high, represents the time taken for tuning FM subsystem 206 to the particular channel, along with the time taken to settle into the frequency corresponding to the channel. The time durations when waveform 304 is low within each channel represents the times when FM subsystem 206 has settled into the frequency of the channel and is ready for channel metrics evaluation. For each channel, waveform 306 represents time periods when channel metrics are evaluated, for example during the time periods when waveform 306 is high. Waveform 308 represents time periods during which the above-described exemplary display backlight control is applied to particular FM channels 302, in order to improve their performance or increase the SNR of FM signals received (or in other words, to lower the threshold for acceptable signal levels, as will be further explained in FIG. 3B).

With reference now to FIG. 3B, beneficial aspects of applying backlight control to particular FM channels 302 of FIG. 3A are illustrated. Example FM channels 312 and 314 out of FM channels 302 are considered. Backlight control may be as described above, wherein, brightness of backlight 280 may be controlled by means of conveying FM modes to controller 272 for example. Backlight control may be applied for FM channel 312, whereas for FM channel 314, backlight control is not applied. Waveform 310 represents the minimum RSSI or signal strength of FM signals that is required to be received from a broadcast station, which would be sufficient for acceptable user experience with regard to FM channels 312 and 314. In more detail, the RSSI for FM channel 312 is required to be above the illustrated "threshold 2," where threshold 2 represents the minimum RSSI needed for FM channel 312 to provide acceptable user experience. On the other hand, the RSSI for FM channel 314 is required to be above the illustrated "threshold 1," where threshold 1 is higher than threshold 2, to provide acceptable user experience. In other words, when backlight control is not applied, the noise experienced by FM subsystem 206 is so high that a higher RSSI is required as in the case of FM channel 314; whereas when backlight control is applied, the noise is lower and a lower RSSI would be sufficient to deliver the desired user experience, as in the case of FM channel 312.

Figure 4:
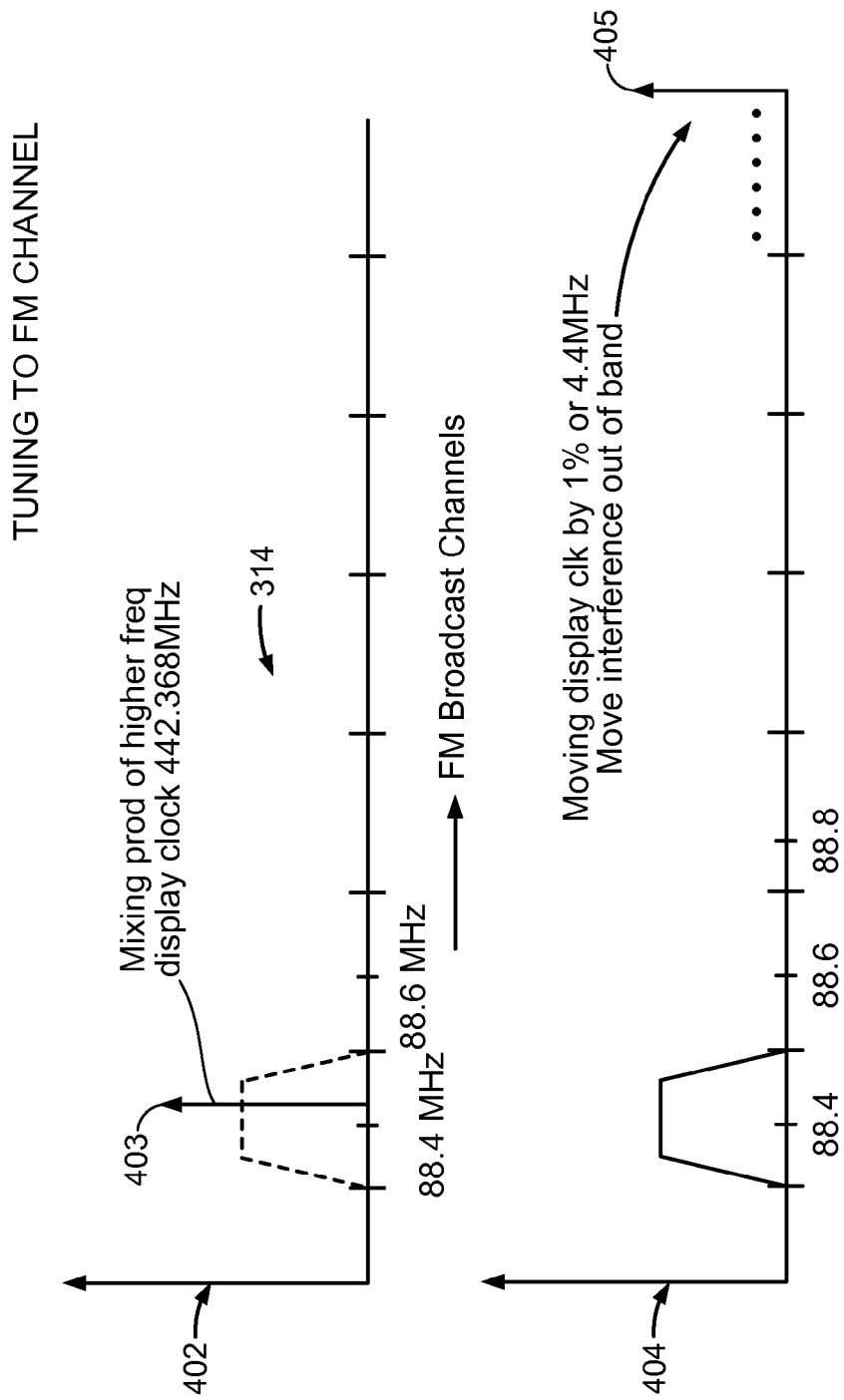

With reference now to FIG. 4, another exemplary operation pertaining to adjusting frequency of the display clock is illustrated, based on knowledge of the FM channel being tuned. In more detail, specific FM channels may be known to be affected due to particular display clock frequencies. Waveform 402 represents a mixing product of FM clock frequency (e.g., frequency of FM clock 226) with display clock frequency (e.g., frequency of display clock 276) over multiple FM channels. The mixing product is high when the frequencies of FM clock 226 and display clock 276 collide at a particular frequency, or at the point of coherency. In the illustration, peak 403 is formed at the mixing product at a frequency of 88.4 MHz. This means that display clock 276 is at a harmonic frequency of 88.4 MHz. While tuning the FM channels, high noise or interference will be observed at this frequency, which will lead to poor user experience, unless display clock 276 is adjusted. Accordingly, waveform 404 illustrates an exemplary aspect when display clock 276 is adjusted by merely 1%, or in this case, by 4.4 MHz, to move the display clock frequency to a point 405. At this point, the interference is eliminated at the FM channel around frequency 88.4 MHz. In this manner, knowledge of the FM channel that is being tuned to can be used to make minor adjustments to display clock 276 in such a manner as to eliminate the coherency issue at the FM channels of interest and improve user experience.

From the above sections, it is seen that FIGS. 3-4 represent adjustments related to the first direction, i.e., related to adjustments of parameters of display subsystem 256 based on modes of operation of FM subsystem 206, as well as some aspects related to the second direction, i.e., adjusting the FM mode of operation or implementing filters in FM subsystem 206. In more detail, in the second direction, adjustments may be made within FM subsystem 206, based on knowledge of parameters of display subsystem 256. For example, with continuing reference to FIG. 4, a damping filter (e.g., filter 230 of FIG. 2B) may be implemented in FM subsystem 206 to suppress the noise or interference which is known to arise at 88.4 MHz, which corresponds to the display clock frequency. Once again, this second direction may be implemented by means of interface 208 to convey information regarding display subsystem 256 to FM subsystem 206 in a dynamic manner, and additionally or alternatively, may be implemented by processor 206. Such dampers or filter 230 may be implemented in FM subsystem 206, for selectively filtering out certain harmonics which are known to be problematic. In further aspects, display subsystem 256 may inform FM subsystem 206 of changes in parameters related to the display clock frequencies, refresh rates, backlight brightness, etc. FM subsystem 206 may be then configured to implement filters such as filter 230 to dampen spurs for particular harmonics or FM bands which may be affected by these changed parameters. Thus, noise spurs can be damped at FM bands which FM subsystem 206 is currently operating in.

In some aspects, combinations of the first and second directions of adjustments to eliminate concurrency between display subsystem 256 and FM subsystem 206 are possible. Display subsystem 256 may also be configured to dynamically query FM subsystem 206 for FM modes of operation, and additionally or alternatively, FM subsystem 206 may query display subsystem 256 for changes in parameters based on FM modes of operation, and the above adjustments may be performed at either or both ends for mitigation of noise.

Figure 5:
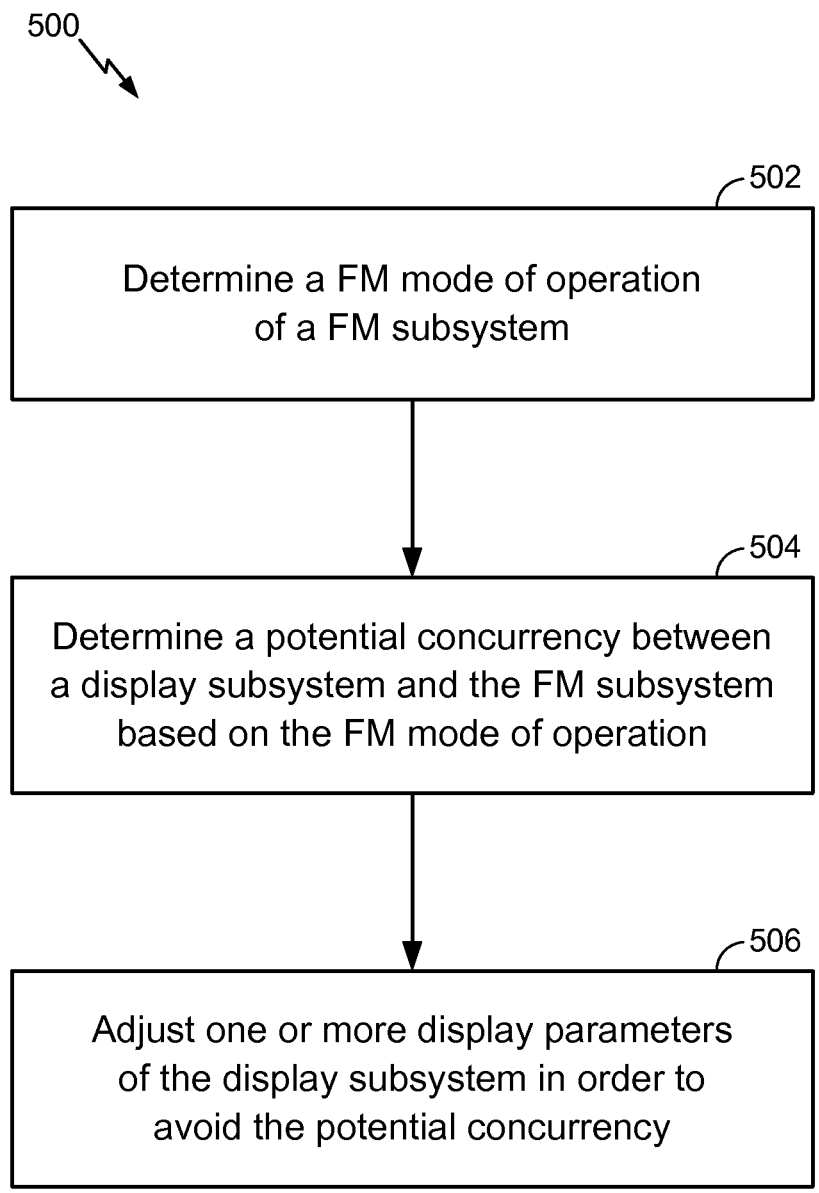
FIG. 5 is a flow chart illustrating a process of avoiding or mitigating FM-display concurrency in an exemplary device.

It will be appreciated that embodiments include various methods for performing the processes, functions, or algorithms disclosed herein. For example, as illustrated in FIG. 5, an embodiment can include a method 500 of reducing FM-display concurrency in a device (e.g., device 200 of FIG. 2A), the method comprising: determining a FM mode (e.g., FM channel around 88.4 MHz in FIG. 4) of operation of a FM subsystem (e.g., FM subsystem 206 of FIG. 2A)—Block 502; determining a potential concurrency (e.g., at 88.4 MHz in FIG. 4) between a display subsystem (e.g., display subsystem 256 of FIG. 2A) and the FM subsystem based on the FM mode of operation—Block 504; and adjusting one or more display parameters of the display subsystem (e.g., adjusting display clock 276 by 1% in FIG. 4) in order to avoid the potential concurrency—Block 506.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of aspects of this disclosure.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method of reducing FM-display concurrency in a device. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of reducing frequency modulation (FM)-display concurrency in an electronic device, the method comprising:
   determining a FM mode of operation of a FM subsystem;
   determining a potential concurrency between a display subsystem and the FM subsystem based on the FM mode of operation;
   adjusting one or more display parameters of the display subsystem in order to avoid the potential concurrency; and
   lowering a threshold for required received signal strength for the FM subsystem, based on the one or more display parameters of the display subsystem adjusted to avoid the potential concurrency.

2. The method of claim 1, wherein the FM subsystem is configured for sending, receiving, and processing FM signals and the display subsystem is configured for providing a display to a user.

3. The method of claim 1, wherein the FM mode of operation comprises one or more FM operating bands or FM channels.

4. The method of claim 1, wherein the one or more display parameters comprise one or more of a display refresh rate, display clock frequency, or backlight brightness.

5. The method of claim 1, further comprising implementing a filter in the FM subsystem to dampen the potential concurrency.

6. The method of claim 1, wherein the potential concurrency pertains to a frequency of a display clock of the display subsystem coinciding with a FM clock of the FM subsystem.

7. The method of claim 1, wherein determining the potential concurrency is based on a dynamic communication of the one or more display parameters from the display subsystem to the FM subsystem or to a processor coupled to the FM subsystem and the display subsystem.

8. The method of claim 1, wherein determining the potential concurrency is based on prior knowledge of the one or more display parameters.

9. The method of claim 1, further comprising:
   determining a harmonic frequency of the display subsystem; and
   adjusting an FM channel frequency in order to avoid interference with the harmonic frequency.

10. The method of claim 9, wherein adjusting the FM channel frequency comprises shifting the FM channel to a frequency which avoids interference with the harmonic frequency of the display subsystem.

11. The method of claim 9, wherein adjusting the FM channel frequency comprises implementing a damping filter in the FM subsystem.

12. An electronic device comprising:
   a frequency modulation (FM) subsystem;
   a di splay subsystem;
   a processor configured to determine potential concurrency between the display subsystem and the FM subsystem based on one or more display parameters of the display subsystem and one or more FM modes of the FM subsystem, adjust the one or more display parameters to avoid the potential concurrency, and lower a threshold for required received signal strength for the FM subsystem, based on the one or more display parameters adjusted to avoid the potential concurrency.

13. The electronic device of claim 12, wherein the FM subsystem is configured to send, receive, and process FM signals.

14. The electronic device of claim 13, wherein the one or more FM modes comprise one or more FM operating bands or FM channels.

15. The electronic device of claim 13, wherein the FM subsystem comprises a filter configured to dampen the potential concurrency.

16. The electronic device of claim 12, wherein and the display subsystem is configured to provide a display to a user.

17. The electronic device of claim 16, wherein the display subsystem comprises a controller, a driver, a display clock, a display panel, and a backlight.

18. The electronic device of claim 17, wherein the one or more display parameters comprises one or more of a display refresh rate of the display panel, display clock frequency of the display panel, or a backlight brightness of the backlight.

19. The electronic device of claim 12, wherein the potential concurrency pertains to a frequency of a display clock of the display subsystem coinciding with a FM clock of the FM subsystem.

20. A system comprising:
   means for determining a frequency modulation (FM) mode of operation of a FM subsystem;
   means for determining a potential concurrency between a display subsystem and the FM subsystem based on the FM mode of operation;
   means for adjusting one or more display parameters of the display subsystem in order to avoid the potential concurrency between the FM subsystem and the display subsystem; and
   means for lowering a threshold for required received signal strength for the FM subsystem based on the one or more display parameters adjusted to avoid the potential concurrency.

21. The system of claim 20, wherein the FM subsystem comprises means for sending, receiving, and processing FM signals, and the display subsystem comprises means for providing a display to a user.

22. The system of claim 20, wherein the FM mode of operation comprises one or more FM operating bands or FM channels.

23. The system of claim 20, wherein the one or more display parameters comprise one or more of a display refresh rate, display clock frequency, or backlight brightness.

24. The system of claim 20, further comprising means for implementing a filter in the FM subsystem to dampen the potential concurrency.

25. The system of claim 20, wherein the potential concurrency pertains to a frequency of a display clock of the display subsystem coinciding with a FM clock of the FM subsystem.

26. The system of claim 20 further comprising:
   means for determining a harmonic frequency of the display subsystem; and
   means for adjusting an FM channel frequency in order to avoid interference with the harmonic frequency.

27. A non-transitory computer-readable storage medium comprising code, which, when executed by a processor, causes the processor to perform operations for reducing frequency modulation (FM)-display concurrency in an electronic device, the non-transitory computer-readable storage medium comprising:
   code for determining a FM mode of operation of a FM subsystem;
   code for determining a potential concurrency between a display subsystem and the FM subsystem based on the FM mode of operation;
   code for adjusting one or more display parameters of the display subsystem in order to avoid the potential concurrency; and
   code for lowering a threshold for required received signal strength for the FM subsystem, based on the one or more display parameters of the display subsystem adjusted to avoid the potential concurrency.

* * * * *